United States Patent
Hwang

(10) Patent No.: US 8,106,309 B2
(45) Date of Patent: Jan. 31, 2012

(54) FLEXIBLE PRINTED CIRCUIT, DISPLAY DEVICE INCLUDING THE SAME, AND MANUFACTURING METHOD THEREOF

(75) Inventor: In-Yong Hwang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 731 days.

(21) Appl. No.: 12/203,989

(22) Filed: Sep. 4, 2008

(65) Prior Publication Data

US 2009/0148678 A1 Jun. 11, 2009

(30) Foreign Application Priority Data

Dec. 11, 2007 (KR) ........................ 10-2007-0128463

(51) Int. Cl.
*H05K 1/11* (2006.01)
(52) U.S. Cl. ..... 174/261; 174/254; 174/259; 174/114 R; 361/749
(58) Field of Classification Search .......... 174/251, 174/253, 254, 255, 257, 259, 260, 261, 114 R, 174/117 F, 117 FF, 34, 355, 359, 369; 361/748, 361/749, 784, 785, 789, 792
See application file for complete search history.

(56) References Cited

U.S. PATENT DOCUMENTS

| | | | | |
|---|---|---|---|---|
| 6,555,755 | B1 * | 4/2003 | Yanagisawa | 174/254 |
| 7,663,062 | B1 * | 2/2010 | Yang | 174/254 |
| 2004/0174663 | A1 * | 9/2004 | Itokawa | 361/600 |
| 2006/0108699 | A1 * | 5/2006 | Saimen | 257/784 |
| 2006/0158861 | A1 * | 7/2006 | Shouji et al. | 361/750 |
| 2007/0007651 | A1 | 1/2007 | Hashimoto | |
| 2007/0080432 | A1 | 4/2007 | Liu et al. | |

FOREIGN PATENT DOCUMENTS

| | | |
|---|---|---|
| JP | 05-251500 | 9/1993 |
| JP | 06-202136 | 7/1994 |
| JP | 09-055404 | 2/1997 |
| JP | 2001-135896 | 5/2001 |
| JP | 2003-347699 | 12/2003 |
| JP | 2006-013421 | 1/2006 |
| JP | 2006-237158 | 9/2006 |
| KR | 1020010098078 A | 11/2001 |
| KR | 1020020065705 A | 8/2002 |
| KR | 1020040004828 A | 1/2004 |
| KR | 1020050033111 A | 4/2005 |
| KR | 100618898 B1 | 8/2006 |
| KR | 1020060125450 A | 12/2006 |
| KR | 1020070038234 A | 4/2007 |

* cited by examiner

*Primary Examiner* — Hoa C Nguyen
(74) *Attorney, Agent, or Firm* — Cantor Colburn LLP

(57) ABSTRACT

A flexible printed circuit film includes a film including a first region of an adhesion region and a second region outside of the adhesion region, a signal wire formed on the second region, and reinforcement wiring connected to the signal wire and formed on the first region and the second region. The reinforcement wiring includes a bent portion having a plurality of inner corners and a plurality of outer corners, and the inner corners of the reinforcement wiring are spaced apart from a boundary between the first region and the second region. Accordingly, even though an external force is applied to the flexible printed circuit film, the reinforcement wiring may be prevented from being easily damaged.

21 Claims, 5 Drawing Sheets

FLEXIBLE PRINTED CIRCUIT, DISPLAY DEVICE INCLUDING THE SAME, AND MANUFACTURING METHOD THEREOF

This application claims priority to Korean Patent Application No. 10-2007-0128463, filed on Dec. 11, 2007, and all the benefits accruing therefrom under 35 U.S.C. §119, the contents of which in its entirety are herein incorporated by reference.

BACKGROUND OF THE INVENTION (a) Field of the Invention

The present invention relates to a flexible printed circuit film, a display device including the same, and a manufacturing method thereof. More particularly, the present invention relates to a flexible printed circuit film adapted to withstand bending, a display device including the same, and a manufacturing method of the display device.

(b) Description of the Related Art

A liquid crystal display ("LCD"), a plasma display panel ("PDP"), a flat emission display ("FED"), a vacuum fluorescent display ("VFD"), and an organic light emitting device ("OLED") are among widely used flat panel displays.

The flat panel displays generally include a display panel and a signal controller for supplying signals to the display panel. The display panel receives the signals through a flexible printed circuit film connected to the signal controller. Driver integrated circuit ("IC") chips of the display panel are mounted as types such as chip on glass ("COG"), film on glass ("FOG"), and tape carrier package ("TCP"). In the COG type and the FOG type, the IC chips are formed on the substrate of the display panel, and the IC chips are formed on the flexible printed circuit film in the TCP type.

The flexible printed circuit film includes a film, metal wiring formed on the film, and a passivation layer formed on the metal wiring. Generally, the flexible printed circuit film is bent, an end portion thereof is connected to the edge of the substrate, and the other end portion thereof is connected to a portion that supplies the signals.

When various forces occur on the completely manufactured display device, the stress is focused on the end portion of the flexible printed circuit film, that is to say, the portion where the bend is started. Also, as the one end portion of the flexible printed circuit film is attached to the edge of the substrate, the stress is next focused on the bent portion of the flexible printed circuit film in the manufacturing process in which the flexible printed circuit film is bent and the other end portion thereof is attached to the supply portion.

Particularly, according to the conventional art, because the stress is focused on the metal wiring disposed on the portion where the bend of the flexible printed circuit film is started, disconnections are frequently generated by weak forces. Furthermore, the disconnections of the metal wiring generate screen deteriorations, thereby decreasing the quality and the productivity of the products.

BRIEF SUMMARY OF THE INVENTION

The present invention provides a flexible printed circuit film and a display device using the same to prevent metal wiring from easily deteriorating even though external forces occur on the flexible printed circuit film. The present invention also provides a method of manufacturing a display device including the flexible printed circuit film.

A flexible printed circuit film according to exemplary embodiments of the present invention includes a film including a first region of an adhesion region and a second region outside of the adhesion region, a signal wire formed on the second region, and reinforcement wiring connected to the signal wire and formed on the first region and the second region, wherein the reinforcement wiring includes a bent portion having a plurality of inner corners and a plurality of outer corners, and the inner corners of the reinforcement wiring are spaced apart from a boundary between the first region and the second region.

The inner corners may be spaced apart from the boundary by more than about 10 µm.

A flexible printed circuit film according to another exemplary embodiment of the present invention includes a film and reinforcement wiring formed on the film and including a bent portion having a plurality of inner corners and a plurality of outer corners, wherein the inner corners are disposed at different positions according to a length direction of the reinforcement wiring.

A flexible printed circuit film according to another exemplary embodiment of the present invention includes a film including a first region of an adhesion region and a second region outside of the adhesion region, a signal wire formed on the second region, and reinforcement wiring connected to the signal wire and formed on the first region and the second region. The reinforcement wiring includes a first branch, a second branch separated from the first branch, and a connection for connecting the first branch and the second branch to each other, wherein two facing edges of the first branch and second branch and an end portion of the connection form the bent portion of the reinforcement wiring.

The width of the first branch may be in a range of from about 50% to about 70% of a pitch of the reinforcement wiring. An interval between the first branch and the second branch may be in a range of from about 30% to about 50% of the pitch of the reinforcement wiring. The pitch of the reinforcement wiring may be in the range of about 10 µm to about 200 µm.

The end portion of the connection may be disposed in the second region. Alternatively, the end portion of the connection may be disposed in the first region. Alternatively, an end portion of at least one connection may be disposed in the first region and an end portion of at least one connection may be disposed in the second region where a plurality of branches is provided.

The flexible printed circuit film may further include a passivation layer formed on the second region, and covering the signal wire and at least a portion of the reinforcement wiring.

A display device according to an exemplary embodiment of the present invention includes one among the above-described flexible printed circuit films.

A display device according to another exemplary embodiment of the present invention includes a display panel, a flexible printed circuit film including wiring, the flexible printed circuit film including a film including an adhesion region and a remaining region outside of the adhesion region, and an adhesive adhering the display panel and the flexible printed circuit film to each other and attached to the adhesion region of the flexible printed circuit film. The wiring includes a signal wire and reinforcement wiring connected to the signal wire, and includes a bent portion having a plurality of inner corners and a plurality of outer corners, and the inner corners of the reinforcement wiring are spaced apart from a boundary between the adhesion region and the remaining region.

The flexible printed circuit film may be bent. The bend of the flexible printed circuit film may be started at the boundary.

The reinforcement wiring may include a plurality of branches and a connection, and the branches may be connected to each other through the connection. An inner corner among the inner corners may be a portion where one side of one branch among the branches and one side of the connection meet each other.

The width of each branch may be in a range of about 50% to about 70% of the pitch of the reinforcement wiring. The width of the connection may be in a range of from about 30% to about 50% of the pitch of the reinforcement wiring. The pitch of the reinforcement wiring may be in a range of about 10 μm to about 200 μm.

The display device may further include an integrated circuit ("IC") chip disposed on the flexible printed circuit film. The display device may further include an IC chip disposed on the display panel.

A manufacturing method of a display device according to an exemplary embodiment of the present invention includes forming a signal wire on a film, forming reinforcement wiring connected to the signal wire and including a bent portion having a plurality of inner corners and a plurality of outer corners on the film, forming an adhesive on one of the display panel and the film, and adhering the film and the display panel to form an interval for the inner corners of the reinforcement wiring spaced from the boundary of the adhesive.

BRIEF DESCRIPTION OF THE DRAWINGS

The above and other features and advantages of the present invention will become apparent by describing in detail exemplary embodiments thereof with reference to the attached drawings in which.

DETAILED DESCRIPTION OF THE INVENTION

Figure 1:
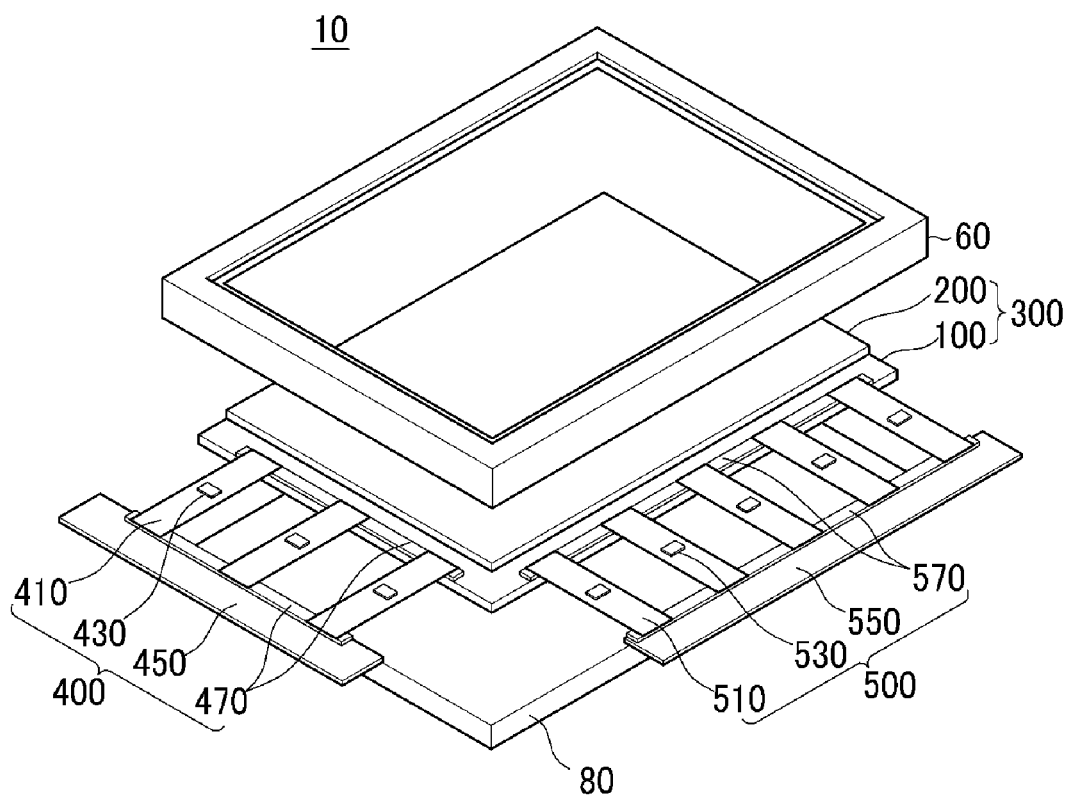
FIG. 1 is a perspective view of an exemplary display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. A flexible printed circuit film according to an exemplary embodiment of the present invention may be adapted to the various display devices such as a liquid crystal display ("LCD"), a plasma display device, a field emission display ("FED"), a fluorescent display panel, and an organic light emitting device ("OLED"). In the accompanying drawings, an LCD is shown and an exemplary embodiment of the present invention is explained based on an LCD, but the display device according to an exemplary embodiment of the present invention is not limited by the LCD.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section described below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealize embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Now, a display device according to an exemplary embodiment of the present invention will be described in detail with the reference to FIG. 1 to FIG. 5.

Figure 2:
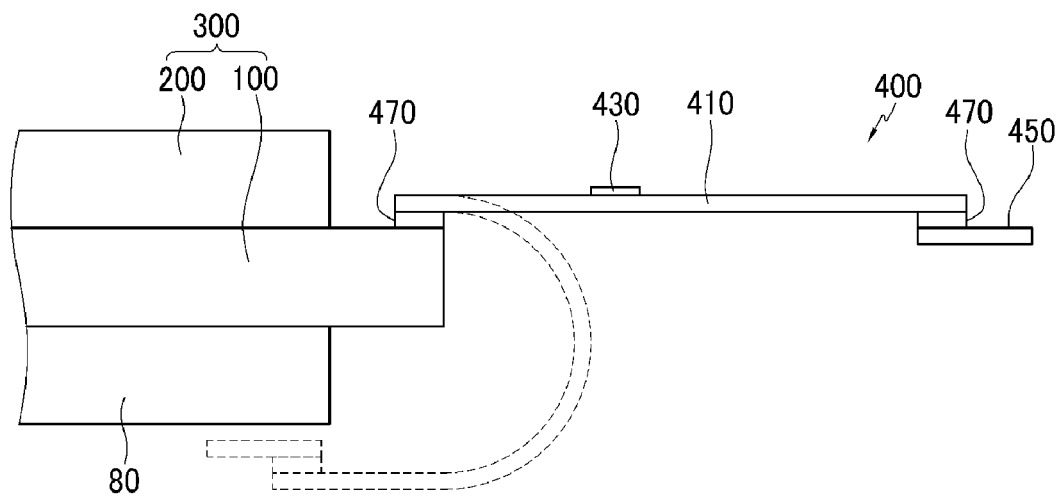
FIG. 2 is a side view of the exemplary display device shown in FIG. 1.

FIG. 1 is a perspective view of an exemplary display device according to an exemplary embodiment of the present invention, and FIG. 2 is a side view of the exemplary display device shown in FIG. 1. However, the cover 60 shown in FIG. 1 is not illustrated in FIG. 2.

Referring to FIG. 1 and FIG. 2, a display device 10 according to the present exemplary embodiment includes a display panel unit 300, a gate driver 400, a data driver 500, and a lighting unit 80.

The display panel unit 300 includes a lower panel 100, an upper panel 200, and an electro-optic layer (not shown). However, the display panel unit 300 may include only one display panel or three or more display panels.

The lower panel 100 includes a substrate and a thin film structure formed thereon. The substrate may be made of a transparent insulating material such as glass or plastic. The thin film structure includes a pixel electrode, a thin film transistor ("TFT"), and various signal lines, and they are preferably made of conductors and insulating materials. Although not shown in the drawings, one example of the structure of the lower panel 100 will be schematically described.

In an exemplary embodiment of the lower panel 100, a plurality of gate lines are formed on a lower substrate. A gate insulating layer is formed on the gate lines, a semiconductor and ohmic contacts are sequentially formed, and a plurality of data lines and a plurality of drain electrodes are formed thereon. Each gate line includes a plurality of gate electrodes and each data line includes a plurality of source electrodes, and the gate electrode, the semiconductor, the source electrode, and the drain electrode form a TFT. A passivation layer is formed the semiconductor, the data line, the drain electrode, and the gate insulating layer, and a plurality of pixel electrodes are formed on the passivation layer. The pixel electrodes are connected to the drain electrode through contact holes in the passivation layer.

The upper panel 200 faces the lower panel 100, and is smaller than the lower panel 100 such that a portion of the edge of the lower panel 100 is not covered by the upper panel 200 such that it is exposed. The upper panel 200 includes a substrate and a thin film structure. The substrate is preferably made of a transparent insulating material such as glass or plastic. The thin film structure includes a common electrode, color filters, and a light blocking member, and they are made of conductors and insulating materials. Although not shown in the drawings, one example of the structure of the upper panel 200 will be schematically described.

In an exemplary embodiment of the upper panel 200, a light blocking member is formed on the substrate. The light blocking member faces pixel electrodes, and includes a plurality of openings having almost the same planar shape as the pixel electrodes and prevents light leakage between the pixel electrodes. An overcoat is formed on the substrate and the light blocking member, and a common electrode is formed on the overcoat. A plurality of color filters is formed between the substrate and the overcoat layer. Most of each color filter is disposed on the opening of the light blocking member, and may display one among a set of colors such as primary colors, and such as colors including red, green, and blue.

The above-described structures of the lower panel 100 and the upper panel 200 are merely examples, and may be variously changed. For example, at least one of the common electrode, the color filter, and the light blocking member may be included in the lower panel 100. Also, the lower panel 100 may further include a storage electrode.

An electrical-optic layer is disposed between the lower panel 100 and the upper panel 200, and when the display panel unit 300 includes one display panel, it is disposed on the display panel. The material of the electrical-optic layer is changed according to the kind of the display device, and it may be a liquid crystal material in the case of an LCD and it may be an organic light emitting material in the case of an OLED.

The gate driver 400 and data driver 500 respectively include a flexible printed circuit film 410 and 510, an integrated circuit ("IC") chip 430 and 530, a printed circuit board ("PCB") 450 and 550, and a conductive adhesive 470 and 570. Because the gate driver 400 and the data driver 500 have similar structures, the structure of the gate driver 400 will be described in detail hereafter.

Figure 3:
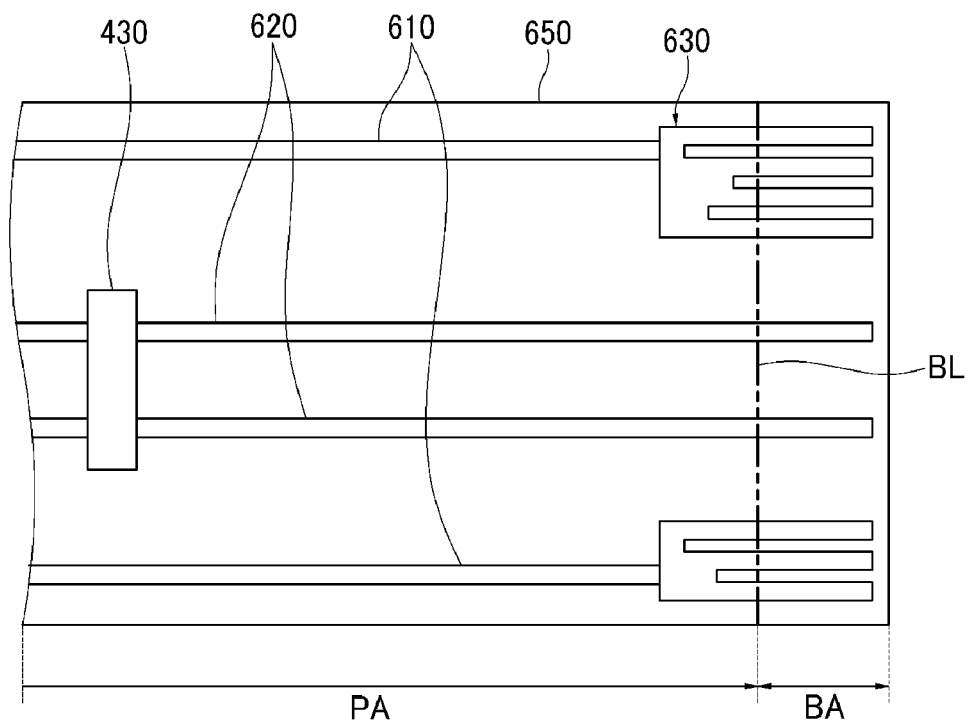
FIG. 3 is an enlarged view of the exemplary flexible printed circuit film shown in FIG. 1.

With additional reference to FIG. 3, the flexible printed circuit film 410 includes a film 650, metal wiring formed on the film 650 as a signal wire 610 and reinforcement wiring 630, and a passivation layer formed on the metal wiring.

An end portion, such as a first end portion, of the flexible printed circuit film 410 is attached to the exposed edge portion of the lower panel 100 through a conductive adhesive 470, and the other end portion thereof, such as a second end portion, is attached to the PCB 450, which is a signal supply unit, through the conductive adhesive 470. The conductive adhesive 470 is an anisotropic conductive film ("ACF"), and the metal wiring of the flexible printed circuit film 410 and the wiring of the lower panel 100 and PCB 450 are electrically connected to each other through conductive particles included in the ACF.

The IC chip 430 is formed on the flexible printed circuit film 410 in a TCP type. Here, the flexible printed circuit film 410 is bent, and the PCB 450 is disposed under the lower panel 100 to form a bent TCP. Alternatively, the flexible printed circuit film 410 may not be bent such that it may be parallel, in a flat TCP. On the other hand, the IC chip 430 may be mounted on the display panel unit 300 in either a COG or FOG type.

The data driver 500 is shown in FIG. 1, and the data driver 500 has almost the same structure as that of the gate driver 400.

Here, at least one of the gate driver 400 and the data driver 500 may be omitted, and the function of the omitted portion may be combined to the other portion.

The lighting unit 80 is disposed inside the display device 10, such as below the display panel unit 300, and a cover 60 is disposed on the display panel unit 300. The display panel unit 300 may be fixed to the lighting unit 80 through the cover 60.

In an exemplary embodiment, the lighting unit 80 includes a light source, a light guide, and a reflection member, which are not shown. The light source may be a fluorescent lamp such as a cold cathode fluorescent lamp ("CCFL"), an external electrode fluorescent lamp ("EEFL"), or a light emitting diode ("LED"), and always emits light with a uniform brightness regardless of the state of the display device 10. The light guide guides the light emitted from the light source, and the reflection member reflects the reflected light from the light guide in the direction of the display panel unit 300 to minimize the loss of light.

Next, the flexible printed circuit film will be described in detail with reference to FIG. 3 to FIG. 5.

FIG. 3 is an enlarged view of the exemplary flexible printed circuit film of the gate driver 400 shown in FIG. 1. The flexible printed circuit film 510 of the data driver 500 is not shown, but the structure thereof may be the same, or substantially the same, as that of the flexible printed circuit film 410 of the gate driver 400.

Referring to FIG. 3, metal wiring is formed on the film 650. The metal wiring includes a signal wire 610, connection wiring 620, and reinforcement wiring 630. A passivation layer (not shown) is formed on the signal wire 610, the connection wiring 620, and the reinforcement wiring 630. An IC chip 430 is disposed on the passivation layer. The passivation layer may be a solder resist.

The film 650 may be divided into an adhesion region BA and a remaining region PA. The adhesion region BA is the portion that is attached to the lower panel 100 through a conductive adhesive 470, and the remaining region PA is the portion that the passivation layer occupies on the film 650. The remaining region PA may be that portion of the film 650 that does not include the adhesion region BA. In the drawing, the adhesion region BA is formed on the right side of the remaining region PA, but it may be formed on the left side of the remaining region PA.

The signal wire 610 is disposed in the remaining region PA, and the reinforcement wiring 630 and the connection wiring 620 range and extend from the remaining region PA to the adhesion region BA. The connection wiring 620 is connected to the IC chip 430 through contact holes that are formed in the passivation layer. However, the signal wire 610 is not connected to the IC chip 430, and an end portion thereof is connected to the reinforcement wiring 630. The signal wire 610 is disposed at the outside of the connection wiring 620.

The reinforcement wiring 630 ranges over the boundary BL. The boundary BL is the end portion of the adhesion region BA, that is, where the bend of the flexible printed circuit film 410 of display device 10 starts in the manufacturing process. The boundary BL is interposed between the adhesion region BA and remaining region PA.

Next, the structure of the reinforcement wiring will be described in detail with reference to FIG. 4 and FIG. 5.

Figure 4:
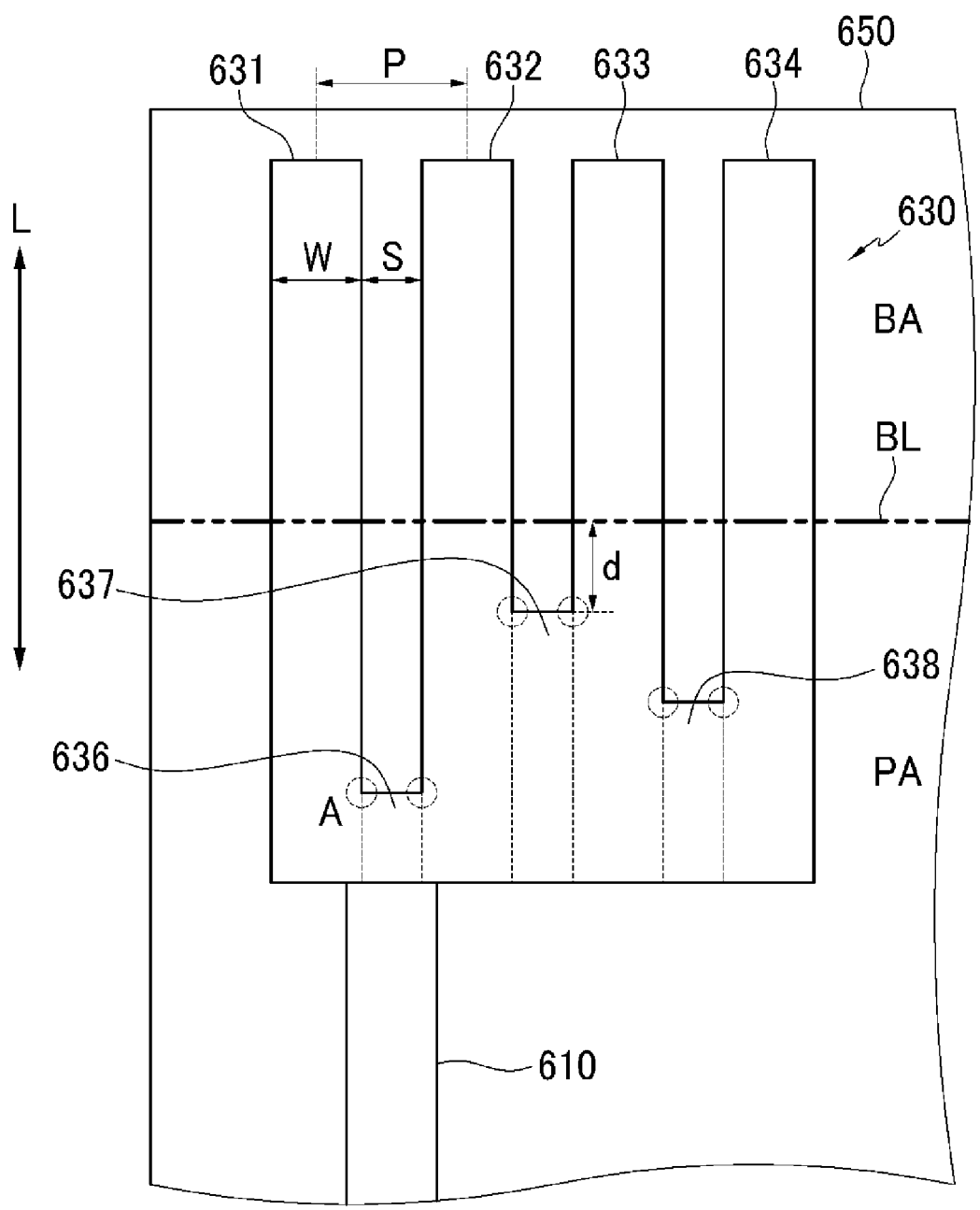
FIG. 4 is an enlarged view of the exemplary reinforcement wiring shown in FIG. 3.
Figure 5:
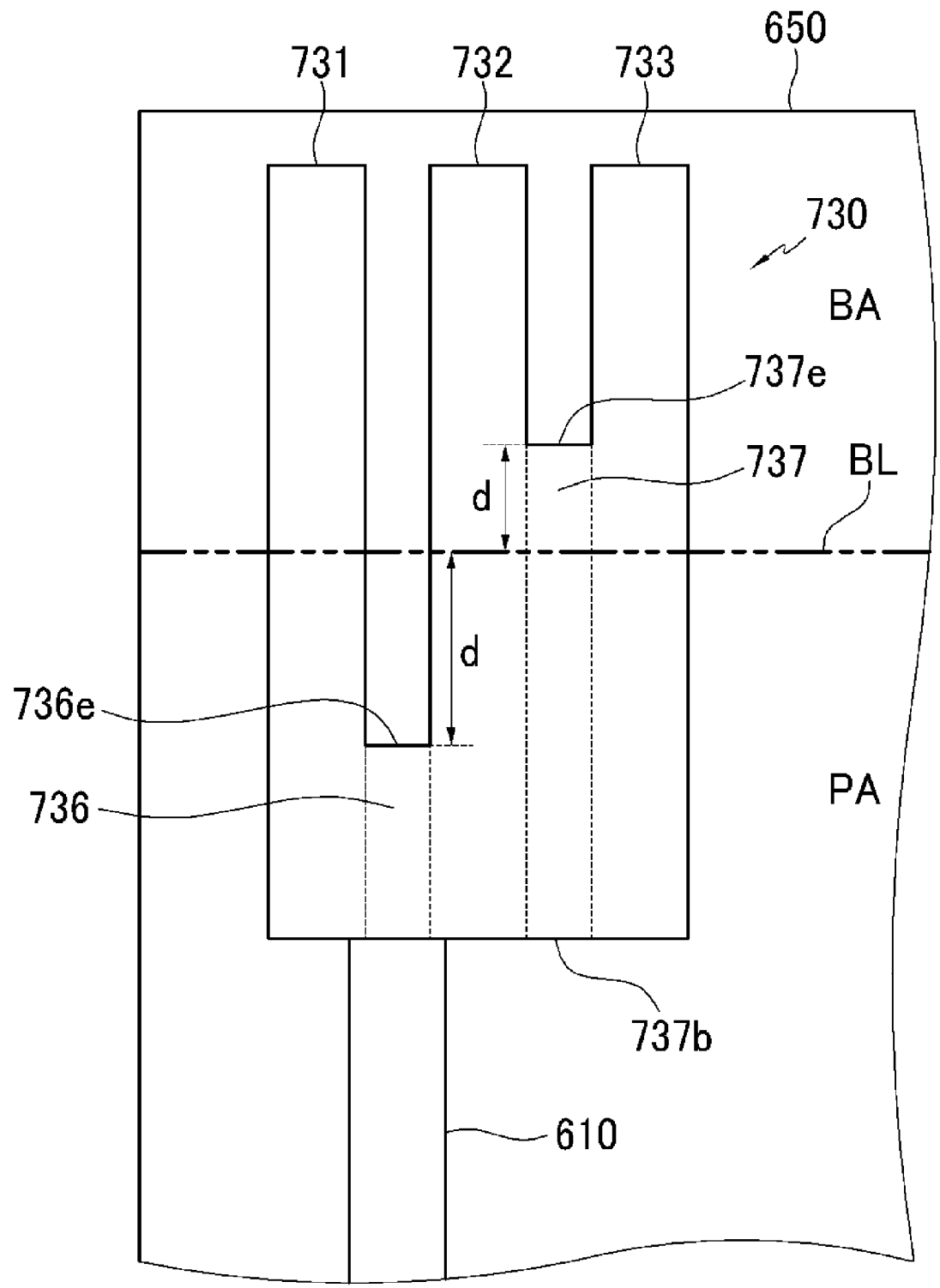
FIG. 5 is a view of the exemplary reinforcement wiring shown in FIG. 4 according to another exemplary embodiment of the present invention.

FIG. 4 is an enlarged view of the exemplary reinforcement wiring shown in FIG. 3, and FIG. 5 is a view of the exemplary reinforcement wiring shown in FIG. 4 according to another exemplary embodiment of the present invention.

Referring to FIG. 4, the reinforcement wiring 630 includes first to fourth branches 631, 632, 633, and 634, and first to third connections 636, 637, and 638. However, the number of branches of the reinforcement wiring 630 may be appropriately changed according to the size of the display device 10. The connections are portions that connect the neighboring branches, and their number is determined to be one less than that of total number of the branches.

The first to fourth branches 631, 632, 633, and 634 have a band shape and are parallel to each other, and the first to third connections 636, 637, and 638 also have a band shape and are parallel to each other.

The first branch 631 and the second branch 632 are connected to each other through the first connection 636, the second branch 632 and the third branch 633 are connected to each other through the second connection 637, and the third branch 633 and the fourth branch 634 are connected to each other through the third connection 638. However, the branches 631, 632, 633, and 634 and the connections 636, 637, and 638 may be integrally formed and made of one body.

Figure 6:
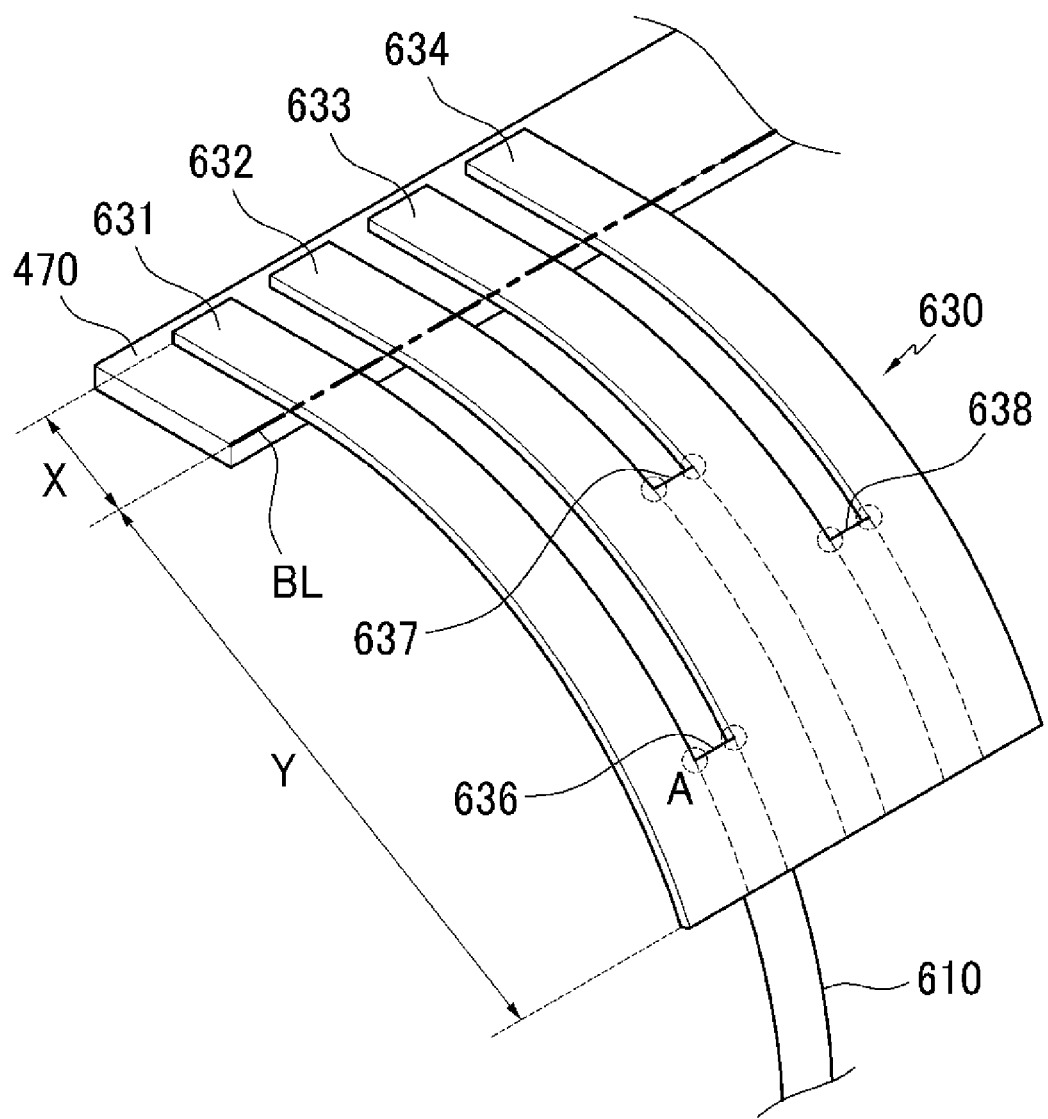
FIG. 6 is an enlarged view of the bent exemplary reinforcement wiring disposed on the conductive adhesive.

Here, the position where the side of one branch among the first to fourth branches 631, 632, 633, and 634 meets with the side of one connection among the first to third connections 636, 637, and 638 is bent and rounded. That is, the position where the side of one branch among the first to fourth branches 631, 632, 633, and 634 meets with the side of one connection among the first to third connections 636, 637, and 638 is located on the remaining region PA which is bent so as to place the PCB 450 on a rear side of the lighting unit 80 as shown in FIG. 2. Corners that are formed by the meeting of the branches 631, 632, 633, and 634 and the connections 636, 637, and 638 are referred to as inner corners As shown in FIGS. 4 and 6. Corners that are formed by the meeting of the sides of each branch 631, 632, 633, and 634 with respective first to third connections 636, 637, and 638 are referred to as outer corners, which are substantially diagonally opposite to respective inner corners A. For example, two outside corners are easily recognized by looking at the two outside bottom corners defining branches 631 and 634. The other outside corners defined by branches 632 and 633 would be easily recognized by separating the branches 632 and 633 at the phantom lines illustrated in FIG. 4 and joined to each other or to one of the outside branches 31, 634, for example. It will be further recognized that all of the outside corners are located in the remaining portion PA and coincide with an edge of the reinforcement region connected to the signal wire 610.

The first to fourth branches 631, 632, 633, and 634 pass the boundary BL and are disposed on the remaining region PA and the adhesion region BA of the film 650. The first to third connections 636, 637, and 638 are disposed on the remaining region PA. The inner corners A are spaced apart from the boundary BL by predetermined distances d. The minimum of the predetermined distances d is about 10 μm, and the maximum value is less than the length of the first to fourth branches 631, 632, 633, and 634. In the illustrated exemplary embodiment, the inner corners A of the first connection 636, the second connection 637, and the third connection 638 are disposed at different positions along the length direction L of the reinforcement wiring 630, and the distance d from the boundary BL varies for each of the first to third connections 636, 637, and 638. However, in an alternative exemplary embodiment, the inner corners A of the first connection 636, the second connection 637, and the third connection 638 may be disposed at the same positions along the length direction L of the reinforcement wiring 630, and the distance d from the boundary BL may be the same or substantially the same for each of the first to third connections 636, 637, and 638.

The first to fourth branches 631, 632, 633, and 634 may have the same width W, or substantially the same width W, as each other and may be arranged with a uniform pitch P. The pitch P may be in the range of about 10 μm to about 200 μm. The width W of each branch 631, 632, 633, and 634 may be in the range of from about 50% to about 70% of the pitch P. An interval S between the neighboring branches 631, 632, 633, and 634, that is say the width of each the connections 636, 637, and 638, may be in the range of from about 30% to about 50% of the pitch P.

If the width W of the branches 631, 632, 633, and 634 is larger than 70% of the pitch P and the interval S of the neighboring branches 631, 632, 633, and 634 is less than 30% of the pitch, a short circuit may be generated between the branches 631, 632, 633, and 634, and when the width W of the branches 631, 632, 633, and 634 is less than 50% of the pitch P and the interval S of the neighboring branches 631, 632, 633, and 634 is larger than 50% of the pitch, the branches 631, 632, 633, and 634 may be easily disconnected.

Referring to FIG. 5, reinforcement wiring 730 includes first to third branches 731, 732, and 733, and first and second connections 736 and 737. The first branch 731 and the second branch 732 are connected to each other through the first connection 736, and the second branch 732 and the third branch 733 are connected to each other through the second connection 737.

The first to third branches 731, 732, and 733 range on the boundary BL, and are disposed on the remaining region PA and the adhesion region BA of the film 650. The first connection 736 is disposed on the remaining region PA, and one end 736e thereof is disposed in the remaining region PA and is spaced apart from the boundary BL by a predetermined distance d. The other end of the first connection 736 is also disposed on the remaining region PA. The second connection 737 is disposed on the remaining region PA and the adhesion region BA. Accordingly, one end 737e of the second connection 737 is spaced apart from the boundary BL by the predetermined distance d and is disposed in the adhesion region BA, and the other end 737b thereof is spaced apart from the boundary BL and is disposed in the remaining region PA. The minimum of the predetermined distance d is about 10 μm.

The characteristics of the pitch P of the reinforcement wiring 630, the width W of the first to fourth branches 631, 632, 633, and 634, and the interval S between the neighboring branches shown in FIG. 4 may be adapted to the reinforcement wiring 730 shown in FIG. 5. Also, while only three branches are shown in the reinforcement wiring 730, an alternative number of branches may be employed, and the ends of the connections between the branches may vary in location between being disposed on the adhesion region BA and on the remaining region PA.

In another exemplary embodiment, the reinforcement wiring of the flexible printed circuit film 410 may use one of the reinforcement wiring 630 shown in FIG. 4 and the reinforcement wiring 730 shown in FIG. 5, and the reinforcement wiring 630 shown in FIG. 4 and the reinforcement wiring 730 shown in FIG. 5 may be used together.

FIG. 6 is an enlarged view of the bent exemplary reinforcement wiring disposed on the conductive adhesive. In FIG. 6, the reinforcement wiring 630 shown in FIG. 4 is shown, and the passivation layer disposed on the reinforcement wiring 630 and the film disposed on the reinforcement wiring 630 are omitted for convenience of the explanation.

Referring to FIG. 6, the first portion X of the first to fourth branches 631, 632, 633, and 634 is disposed in the adhesion region BA (FIG. 3) of the film (650, FIG. 3) and is connected to the conductive adhesive 470. The second portion Y of the first to fourth branches 631, 632, 633, and 634 that are not disposed in the adhesion region BA of the film 650 is disposed with the bent state within the remaining region PA (FIG. 3). The second portion Y is bent starting at the boundary BL. Accordingly, the boundary BL is the portion where the large force is applied to the reinforcement wiring 630 under the bending process of the flexible printed circuit film 410. Also, it is the weakest portion when an external force is applied to the completed display device.

However, in the case of the reinforcement wiring 630 shown in FIG. 6, the inner corner A is disposed away from the boundary BL by a distance such that the first to fourth branches 631, 632, 633, and 634 may have a large permitted stress threshold. Accordingly, even though an external force is applied to the flexible printed circuit film 410, the reinforcement wiring 630 may be prevented from being easily damaged.

In the case of a flexible printed circuit film to which the reinforcement wiring 730 of FIG. 5 is adapted, the same effects may be obtained, and furthermore the same effects may be obtained in a display device manufactured with a flat TCP by adapting the reinforcement wiring 630 and/or 730 of FIG. 4 and/or FIG. 5. A method of manufacturing such a display device may include forming a signal wire on a film, forming reinforcement wiring connected to the signal wire and including a bent portion having a plurality of inner corners and a plurality of outer corners on the film, forming an adhesive on one of the display panel and the film, and adhering the film and display panel to form an interval for the inner corners of the reinforcement wiring from a boundary of the adhesive.

According to an exemplary embodiment of the present invention, the permitted stress threshold of the reinforcement wiring is large such that a damage generating rate of the flexible printed circuit film by an external force may be minimized. Furthermore, according to an exemplary embodiment of the present invention, reliability of a flexible printed circuit film including the reinforcement wiring is improved such that a deterioration generating rate of the display device by a disconnection may be minimized.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flexible printed circuit film comprising:
a film including a first region of an adhesion region and a second region outside of the adhesion region;
a signal wire formed on the second region; and
reinforcement wiring directly connected to the signal wire and formed on the first region and the second region,
wherein the reinforcement wiring includes a bent portion having a plurality of inner corners and a plurality of outer corners, and
the inner corners of the reinforcement wiring are spaced apart from a boundary between the first region and the second region.

2. The flexible printed circuit film of claim 1, wherein the inner corners are spaced apart from the boundary by more than about 10 μm.

3. The flexible printed circuit film of claim 1, wherein the inner corners are disposed at different positions according to a length direction of the reinforcement wiring.

4. The flexible printed circuit film of claim 1, wherein the reinforcement wiring includes:
a first branch;
a second branch separated from the first branch; and
a connection which connects the first branch and the second branch to each other,
and two facing edges of the first branch and second branch and an end portion of the connection form the bent portion of the reinforcement wiring.

5. The flexible printed circuit film of claim 4, wherein a width of the first branch is in a range of from 50% to 70% of a pitch of the reinforcement wiring.

6. The flexible printed circuit film of claim 4, wherein an interval between the first branch and the second branch is in a range of from 30% to 50% of a pitch of the reinforcement wiring.

7. The flexible printed circuit film of claim 6, wherein the pitch of the reinforcement wiring is in a range of 10 μm to 200 μm.

8. The flexible printed circuit film of claim 4, wherein the end portion of the connection is disposed in the second region.

9. The flexible printed circuit film of claim 4, wherein the end portion of the connection is disposed in the first region.

10. The flexible printed circuit film of claim 4, further comprising
a passivation layer formed on the second region, and covering the signal wire and at least a portion of the reinforcement wiring.

11. The flexible printed circuit film of claim 1, wherein the reinforcement wiring includes:
a plurality of branches; and,
a plurality of connections which connect adjacent branches to each other,
and an end portion closest to the boundary of at least one of the connections is formed in the second region and an end portion closest to the boundary of at least one of the connections is formed in the first region.

12. A display device comprising:
a display panel;
a flexible printed circuit film including wiring, the flexible printed circuit film including a film including an adhesion region and a remaining region outside of the adhesion region; and
an adhesive adhering the display panel and the flexible printed circuit film to each other, and attached to the adhesion region of the flexible printed circuit film,
wherein the wiring includes
a signal wire, and
reinforcement wiring directly connected to the signal wire, and including a bent portion having a plurality of inner corners and a plurality of outer corners, and
the inner corners of the reinforcement wiring are spaced apart from a boundary between the adhesion region and the remaining region.

13. The display device of claim 12, wherein the flexible printed circuit film is bent.

14. The display device of claim 13, wherein a bend of the flexible printed circuit film starts at the boundary.

15. The display device of claim 14, wherein:
the reinforcement wiring includes a plurality of branches and a connection;
the branches are connected to each other through the connection; and
an inner corner among the inner corners is a portion where one side of one branch among the branches and one side of the connection meet each other.

16. The display device of claim 15, wherein a width of each branch is in a range of 50% to 70% of a pitch of the reinforcement wiring.

17. The display device of claim 15, wherein a width of the connection is in a range of from 30% to 50% of a pitch of the reinforcement wiring.

18. The display device of claim 17, wherein the pitch of the reinforcement wiring is in a range of 10 μm to 200 μm.

19. The display device of claim 12, further comprising an integrated circuit chip disposed on the flexible printed circuit film.

20. The display device of claim 12, wherein an integrated circuit chip is disposed on the display panel.

21. A manufacturing method of a display device, the method comprising:
forming a signal wire on a film;
forming reinforcement wiring directly connected to the signal wire and including a bent portion having a plurality of inner corners and a plurality of outer corners on the film;
forming an adhesive on one of the display panel and the film; and
adhering the film and display panel to form an interval for the inner corners of the reinforcement wiring spaced from a boundary of the adhesive.

* * * * *